(12) United States Patent
Liao et al.

(10) Patent No.: US 8,780,604 B2
(45) Date of Patent: Jul. 15, 2014

(54) STATE SENSING SYSTEM FOR EFUSE MEMORY

(75) Inventors: Chihhung Liao, Fremont, CA (US);
Phu Nguyen, Dublin, CA (US); Vimal R. Patel, Rochester, MN (US); George F. Paulik, Rochester, MN (US); Peder J. Paulson, Rochester, MN (US); Brian J. Reed, Rochester, MN (US); Salvatore N. Storino, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 13/535,802

(22) Filed: Jun. 28, 2012

(65) Prior Publication Data
US 2014/0003120 A1 Jan. 2, 2014

(51) Int. Cl.
*G11C 17/12* (2006.01)

(52) U.S. Cl.
USPC .................. 365/96; 365/225.7; 365/230.03

(58) Field of Classification Search
USPC .................... 365/96, 225.7, 230.03
See application file for complete search history.

(56) References Cited

U.S. PATENT DOCUMENTS

| | | | |
|---|---|---|---|
| 4,987,560 A | 1/1991 | Hamano et al. | |
| 6,335,897 B1 | 1/2002 | Yoo | |
| 7,489,572 B2 | 2/2009 | Aipperspach et al. | |
| 7,528,646 B2 | 5/2009 | Aipperspach et al. | |
| 7,689,950 B2 | 3/2010 | Aipperspach et al. | |
| 7,710,813 B1 | 5/2010 | Im et al. | |
| 7,725,844 B2 | 5/2010 | Aipperspach et al. | |
| 7,729,188 B2 | 6/2010 | Aipperspach et al. | |
| 7,733,722 B2 | 6/2010 | Aipperspach et al. | |
| 7,764,531 B2 | 7/2010 | Aipperspach et al. | |
| 7,813,167 B2 | 10/2010 | Porter | |
| 7,817,455 B2 | 10/2010 | Fredeman et al. | |
| 2009/0039462 A1 | 2/2009 | Huang | |
| 2009/0323388 A1 | 12/2009 | Lung | |
| 2010/0232248 A1* | 9/2010 | Erickson et al. | 365/225.7 |
| 2013/0039117 A1* | 2/2013 | Lin et al. | 365/96 |

OTHER PUBLICATIONS

IBM, "Utilizing a Blow FET With a Tunable VT to Control eFuse Blow Current", IPCOM000179474, Feb. 13, 2009. http:\\www.ip.com/pubview/IPCOM000179474D.
IBM, "Apparatus for 2D Architecture of Fuse Memory", IPCOM000182375D, Apr. 28, 2009. http://www.ip.com/pubview/IPCOM000182375D.

(Continued)

*Primary Examiner* — Hoai V Ho
(74) *Attorney, Agent, or Firm* — Chad J. Hammerlind; Robert R. Williams

(57) ABSTRACT

An eFuse circuit may include a wordline, a first eFuse, a first logic gate, a first blowFET, and a first bitline discharge device. The first eFuse may have a first end coupled to the wordline and a second end. The first eFuse may have a first resistance when unblown and a second resistance when blown. The first logic gate may be coupled to the first end of the first eFuse. The first logic gate may be capable of driving enough current to blow the first eFuse. The first blowFET may have a source coupled to a first supply voltage, a gate coupled to a program signal, and a drain coupled to the second end of the first eFuse. The first bitline discharge device may have a gate coupled to the second end of the first eFuse, a source coupled to the first supply voltage, and a drain coupled to a first bitline.

20 Claims, 7 Drawing Sheets

(56) References Cited

OTHER PUBLICATIONS

IBM, "Cell and Apparatus for a 2D Assmmetric Fuse Memory Array", IPCOM000190339D, Nov. 24, 2009. http://www.ip.com/pubview/IPCOM000190339D.

IBM, "Low Power Partially Good Memory Chips by Fuse-Blowing Method", IPCOM000100417D, Original disclosure date Apr. 1, 1990, TDB n11 04-90 pp. 233-234, Electronic Publication Mar. 15, 2005. http://www.ip.com/pubview/IPCOM000100417D.

* cited by examiner

STATE SENSING SYSTEM FOR EFUSE MEMORY

FIELD

The present invention relates generally to the data processing field, and more particularly, relates to sensing the logical state of eFuses.

BACKGROUND

Electronic fuses (eFuses) are currently used to configure elements after the silicon masking and fabrication process in integrated circuits. EFuses are non-volatile storage elements that includes either an antifuse, which is a programmable element that provides an initial high resistance and when blown provides a selective low resistance or short circuit; or a fuse, which is a programmable element that provides an initial low resistance and when blown provides a selective high resistance or open circuit. These fuses typically are used to configure circuits for customization or to correct silicon manufacturing defects and increase manufacturing yield. In very large scale integrated circuits, it is common to have fuses, such as eFuses, that can be programmed for various reasons. Among these reasons include invoking redundant elements in memory arrays for repairing failing locations or programming identification information.

SUMMARY

One embodiment is directed to an eFuse circuit. The eFuse circuit may include a wordline, a first eFuse, a first logic gate, a first blowFET, and a first bitline discharge device. The first eFuse may have a first end coupled to the wordline and a second end. The first eFuse may have a first resistance when unblown and a second resistance when blown. The first logic gate may be coupled to the first end of the first eFuse. The first logic gate may be capable of driving enough current to blow the first eFuse. The first blowFET may have a source coupled to a first supply voltage, a gate coupled to a program signal, and a drain coupled to the second end of the first eFuse. The first bitline discharge device may have a gate coupled to the second end of the first eFuse, a source coupled to the first supply voltage, and a drain coupled to a first bitline.

Additional embodiments are directed a method of sensing the state of an eFuse and a design structure that may be used in a design process for an eFuse circuit according to the principles of the invention.

BRIEF DESCRIPTION OF THE DRAWINGS

Embodiments will be better understood from the following detailed description with reference to the drawings, in which.

DETAILED DESCRIPTION

Figure 1:
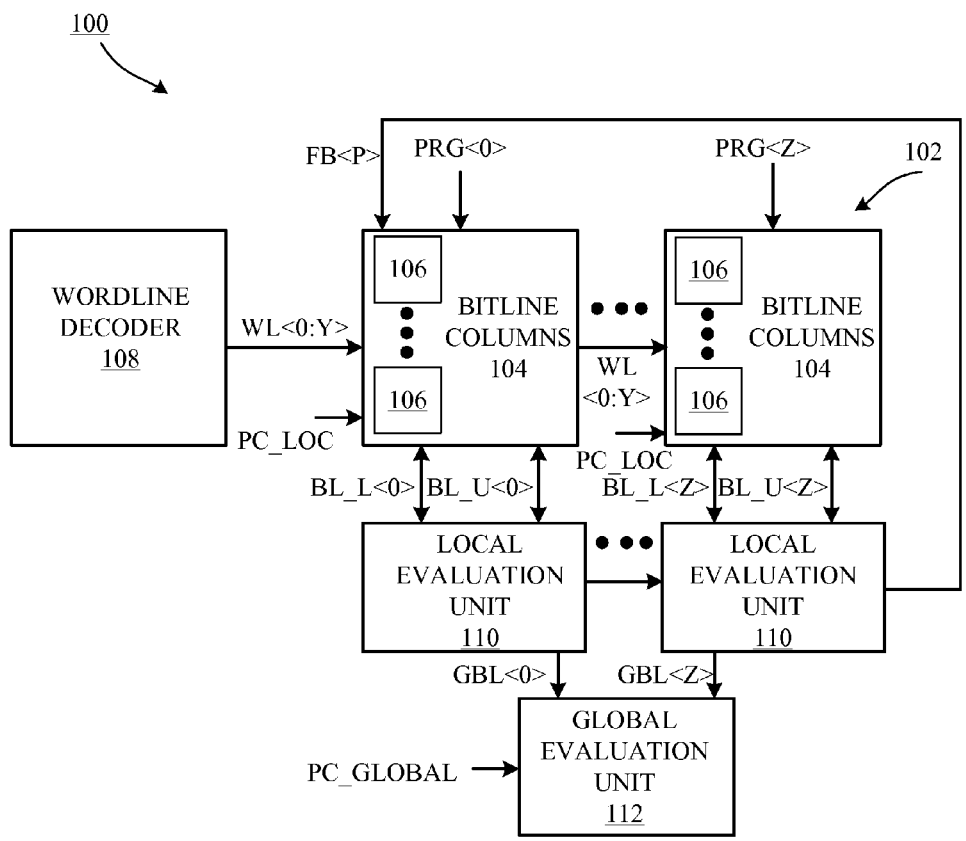
FIG. 1 is a schematic diagram illustrating an exemplary eFuse circuit according to an embodiment.

Embodiments herein provide for an apparatus and method for dynamic sensing the state of an eFuse circuit. Features illustrated in the drawings are not necessarily drawn to scale. Descriptions of well-known components and processing techniques are omitted so as to not unnecessarily obscure the disclosed embodiments. The descriptions of embodiments are provided by way of example only, and are not intended to limit the scope of this invention as claimed. The same numbers may be used in the Figures and the Detailed Description to refer to the same devices, parts, components, steps, operations, and the like.

In electronics, an eFuse is a technology that allows for the dynamic real-time reprogramming of circuits. Generally speaking, circuit logic is generally 'etched' or 'hard-coded' onto a semiconductor device and cannot be changed after the device has finished being manufactured. By incorporating an eFuse (or more realistically, a number of individual eFuses), a semiconductor device manufacturer may allow for the circuits on a device to change while the device is in operation.

Unlike most fuses, eFuses are not true open circuits when blown but maintain a very high resistance. For example, a blown eFuse may have a resistance of approximately 100 kilo-ohms. With the very high resistance blown eFuses behave like open circuits. When an eFuse is blown the final resistance of the eFuse has a distribution depending upon how well electromigration has occurred. How well electromigration occurs depends upon the amount of voltage across the eFuse and the amount of current through the eFuse. Due to process, voltage, and current variation, typically an eFuse does not blow correctly. An incorrectly blown eFuse usually results in a resistance, which is lower than expected. This lower resistance causes a problem in the ability to accurately sense whether an eFuse is blown or not. Lower resistance of a blown eFuse is also a reliability concern.

Sense amplifiers may be used to determine whether an eFuse is in a blown or unblown state by measuring the resistance of the eFuse. Sense amplifiers have increasingly become better at detecting the states of eFuses when the resistance difference between states has decreased. However, known sense amplifiers in eFuse architectures are not without their own weaknesses and have several sensitivities. Current eFuse architectures have high bitline resistance, which requires a large field effect transistor (FET) for blowing the eFuse or high programming voltages. The presence of high bitline resistance may lead to a less reliable blowing of the eFuse. Also, sense amplifiers have a region of uncertainty of several hundred ohms in their detection of the resistance of the eFuses due to threshold voltage (Vt) variation. This region of uncertainty may lead to false positives when detecting unblown eFuses. Furthermore, the use of a sense amplifier may lead to the use of reference resistors and several transistors, which use a large area of the semiconductor device. Additionally, sense amplifiers require a relatively long time to sense the state of an eFuse from anywhere between 2-10 ns. Incorporation of sense amplifiers in an eFuse circuit may also make it difficult to resize the eFuse array, i.e., the number of wordlines.

Figure 2:
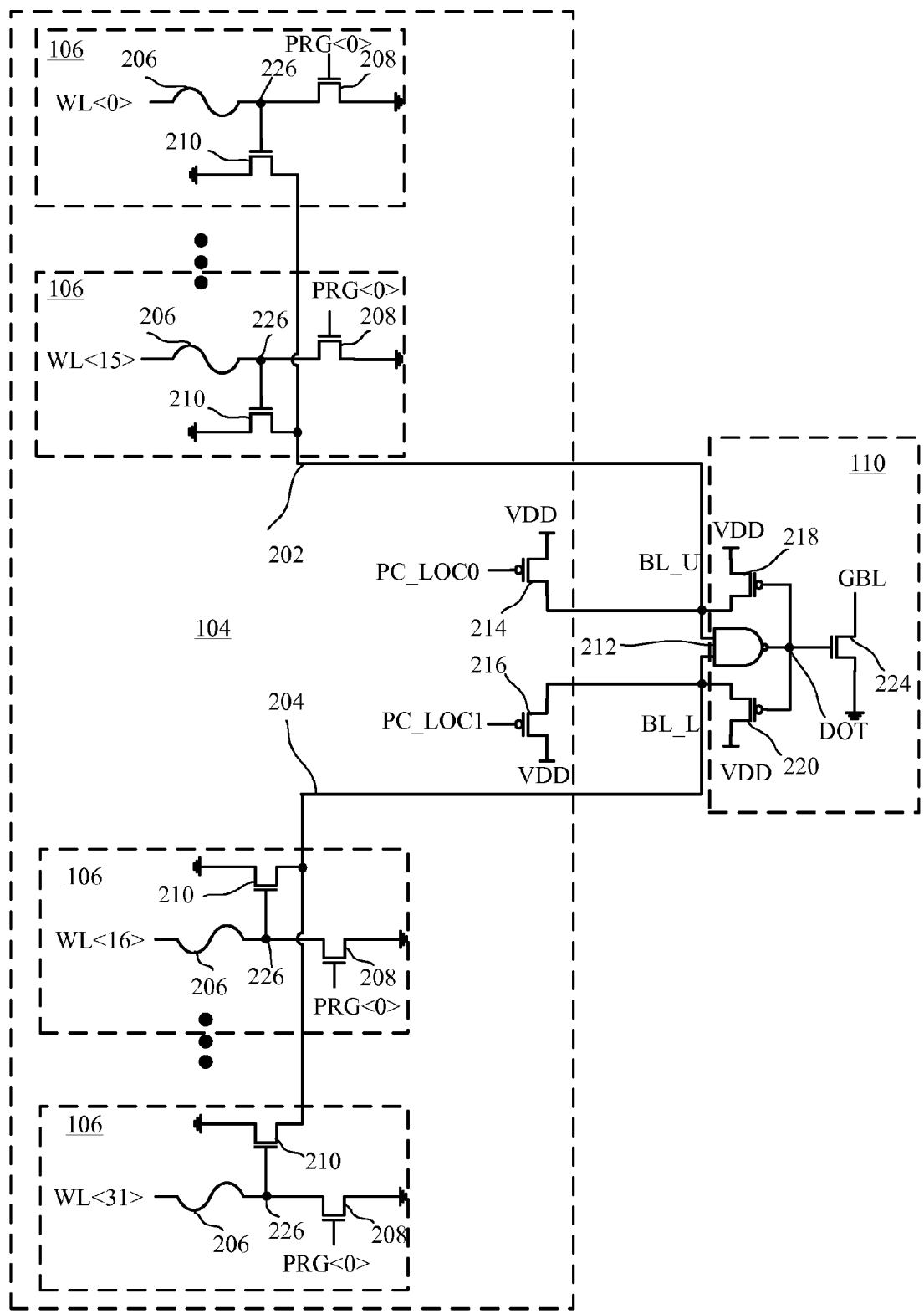
FIG. 2 is a schematic diagram illustrating an exemplary arrangement of eFuse cells with a local evaluation unit of the eFuse circuit of FIG. 1 according to an embodiment.

In FIG. 1, according to one embodiment, a schematic diagram of an eFuse circuit 100 is illustrated. The eFuse circuit 100 may include an eFuse array 102 including one or more bitline columns 104. The bitline columns 104 may include an upper bitline 202 (FIG. 2) and a lower bitline 204 (FIG. 2). Each bitline 202, 204 may be coupled to one or more eFuse cells 106. The upper and lower bitlines 202, 204 may each be coupled to a pre-charge device. The pre-charge device may receive pre-charge signal PC_LOC. PC_LOC may cause the pre-charge device to provide a signal BL_U to the upper bitline 202 and a signal BL_L to the lower bitline 204.

The eFuse circuit 100 may include a wordline decoder 108. The wordline decoder 108 may provide a wordline signal, WL<0:Y>, to address the multiple eFuse cells 106. Also, each bitline column 104 may receive a program signal, PRG<0>-PRG<Z>. PRG<0>-PRG<Z> may signal each eFuse cell 106 to blow the eFuse of the eFuse cell 106.

The eFuse circuit 100 also may include one or more local evaluation units 110. The local evaluation units 110 may receive bitline signals BL_U and BL_L on the upper and lower bitlines 202, 204 respectively. The local evaluation units 110 may determine if an eFuse is blown or unblown from the signals BL_U and BL_L. The local evaluation unit 110 may also help maintain a signal on the upper and lower bitlines 202, 204. The local evaluation units 110 may provide signals GBL<0>-GBL<Z> to a global evaluation unit 112 to determine logical state of the eFuses. The eFuse array 102 may also receive a feedback signal FB<P> from the local evaluation units 110. The FB<P> may be used to correctly sense a blown eFuse by keeping WL<0:Y> active long enough to sense an unblown eFuse.

Referring now to FIG. 2, an exemplary bitline column 104 and local evaluation unit 110 is shown according to one embodiment of the eFuse circuit 100. Bitline column 104 may include the upper bitline 202 and the lower bitline 204. The upper bitline 202 and lower bitline 204 may each contain one or more eFuse cells 106. In FIG. 2, the bitline column 104 includes thirty-two eFuse cells 106, sixteen eFuse cells 106 connected the upper bitline 202 and sixteen eFuse cells 106 connected to the lower bitline 204.

Each eFuse cell 106 may include an eFuse 206, a blowFET 208, and a bitline discharge device 210. The eFuse 206 may have a first resistance and a second resistance. One resistance may be the resistance of the eFuse in a blown state and the other resistance may be the resistance of the eFuse in an unblown state. The eFuse 206 may be an antifuse, which is a programmable element that provides an initial high resistance and when blown provides a selective low resistance or short circuit; or a fuse, which is a programmable element that provides an initial low resistance and when blown provides a selective high resistance or open circuit. Each eFuse 206 may have a first end formed as an input and a second end formed as an output. A respective wordline may be coupled to the inputs of the eFuses 206. The wordline may provide a wordline signal WL<0>-WL<31> to the input of respective eFuse 206. The output of each eFuse 206 may be coupled the node 226.

The drain node of a blowFET 208 may be coupled to node 226. The blowFET 208 may be an N-channel field effect transistor (NFET). The source node of the blowFET 208 may be coupled to a first supply voltage such as ground. Also, the signal PRG<0> may be applied to the gate of the blowFET 208. The bitline discharge device 210 may be an NFET. The gate input of the bitline discharge device 201 may be coupled to node 226. The source node of bitline discharge device 210 may be coupled to the first supply voltage. The drain node of bitline discharge device 210 may be coupled to its respective upper or lower bitlines 202, 204.

During a program operation to blow an eFuse 206, the eFuse 206 may be programmed when the respective signal WL<0>-WL<31> is activated and PRG<0> is applied to the gate of the blowFET 208 activating the blowFET 208. By activating the blowFET 208 and allowing the wordline signal WL<0>, for example, to go to ground may blow the eFuse 206. Driving the programming voltage for blowing an eFuse 206 through the wordline instead of the bitlines and also having the blowFET 208 located next to the eFuse 206 minimizes or completely removes bitline resistance. Having a low bitline resistance may make programming of the eFuse 206 more reliable and faster. Also, having a low bitline resistance may make sensing the state of an eFuse faster. For example, in one embodiment, the state of an eFuse may be detected in approximately 90 ps. Additionally, having a low bitline resistance may result in a lower programming voltage and smaller blowFETs 208, which results in a denser circuit.

The upper and lower bitlines 202, 204 may be coupled with a first pre-charge device 214 and a second pre-charge device 216 respectively. The pre-charge devices 214, 216 may be P-channel field effect transistors (PFETs). The gate inputs of each pre-charge device 214, 216 may receive the signal PC_LOC0 and PC_LOC1 respectively. The source nodes of pre-charge devices 214, 216 may be coupled to a second supply voltage such as VDD. The drain node of the first pre-charge device 214 may be coupled with the upper bitline 202. The drain node of the second pre-charge device 216 may be coupled with the lower bitline 204. An active PC_LOC activates pre-charge devices 214, 216 allowing BL_U and BL_L to transition to VDD.

The upper and lower bitline 202, 204 may also be coupled to the local evaluation unit 110. The upper bitline 202 may provide a signal BL_U to the local evaluation unit 110. BL_U may be received by a first input of the local evaluation unit 110. The lower bitline 204 may provide a signal BL_L to a second input of the local evaluation unit 110.

The local evaluation unit 110 may include a logic gate 212, keeper device 218, keeper device 220 and global evaluation signal device 224. The logic gate 212 may include two inputs and an output. The inputs of the logic gate 212 may be the first and second inputs of the local evaluation unit 110. The logic gate 212 may be a NAND gate. The output of the logic gate 212 may be coupled with the gate inputs of keeper devices 218, 220. The output signal of the logic gate may be referred to as signal DOT.

The keeper devices 218, 220 may be PFETs. A drain node of the keeper device 218 may be coupled to the upper bitline 202. A source node of keeper device 218 may be coupled to the second supply voltage, VDD. Likewise, a drain node of the keeper device 220 may be couple to the lower bitline 204 and a source node of keeper device 220 may be coupled to the second supply voltage, VDD. Keeper devices 218, 220 are sized to prevent leakage from discharging BL_U, BL_L, respectively. The keeper devices 118, 220 may ensure BL_U and BL_L signals do not fall below a threshold voltage (Vt) of the logic gate 212. The threshold voltage Vt may be an input voltage that reliably causes the logic gate 212 to output either a logic 1 or 0.

The local evaluation unit 110 may also include a global evaluation signal device 224. The global evaluation signal device 224 may be coupled to the output of logic gate 212 and receive DOT. The global evaluation signal device 224 may be an NFET. The output of logic gate 212 may be coupled to the gate input of the global evaluation signal device 224 to receive DOT. The source node of global evaluation signal device 224 may be coupled to the first supply voltage. The drain node of the global evaluation signal device 224 may be coupled with a global bitline. The global bitline may have a pre-charged signal GBL. When the global evaluation signal device 224 is activated, GBL is discharged to ground, which signals the global evaluation unit 112 the logical state of an eFuse 206.

Figure 3:
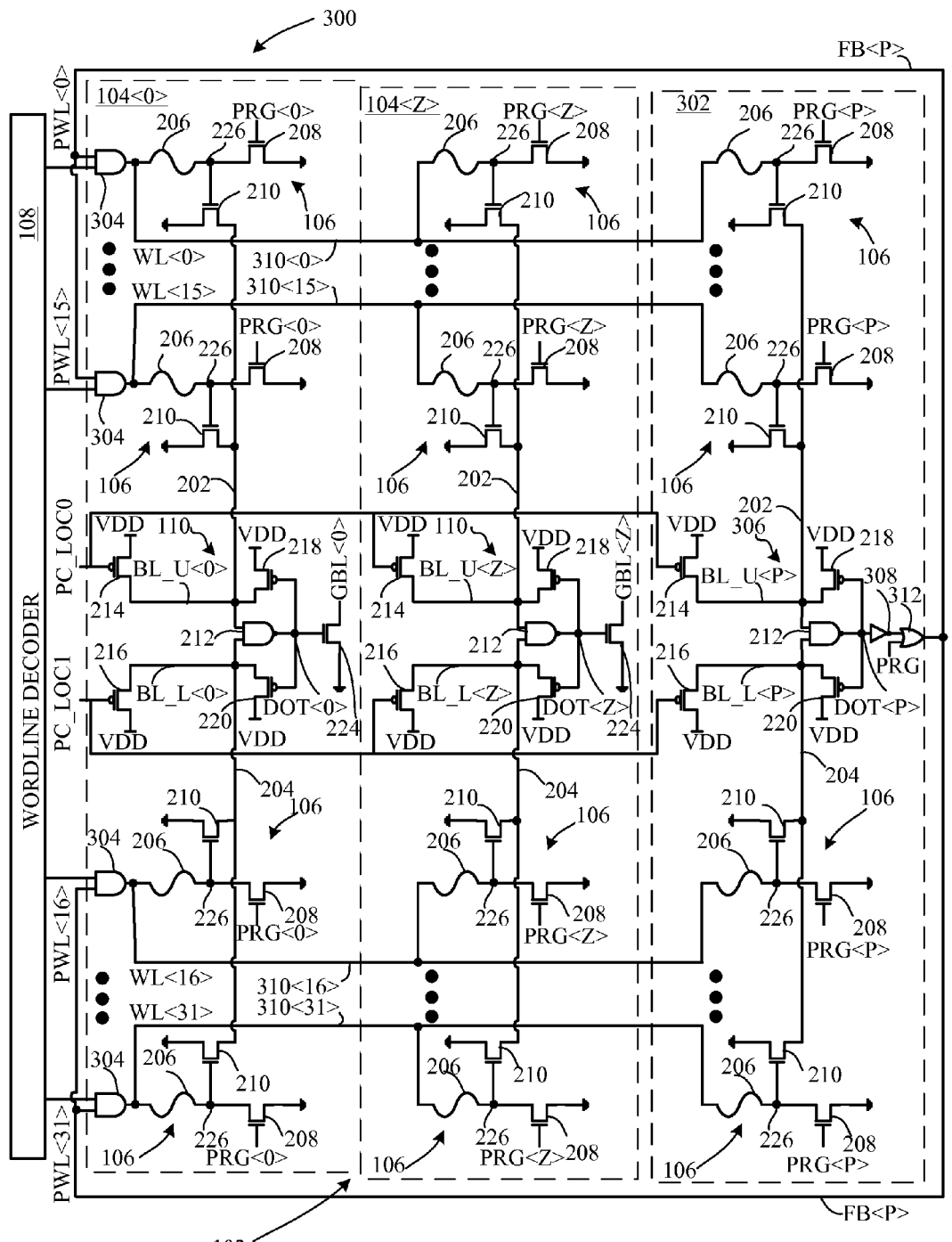
FIG. 3 is a schematic diagram illustrating the exemplary eFuse circuit of FIG. 1 in greater detail, according to an embodiment.

According to one embodiment, FIG. 3 illustrates an eFuse circuit 300. EFuse circuit 300 includes a wordline decoder 108, a plurality of bitline columns 104<0>-104<Z>, and a pseudo bitline column 302. Bitline column 104<0> may include a plurality of feedback sensors 304 in addition to the components of the bitline column 104 (FIG. 2). The feedback sensors 304 may be a logic gate, such as an AND gate. The feedback sensor 304 may have a first input, a second input, and an output. The output of each feedback sensor 304 may be coupled to each wordline 310<0>-310<31>. Each wordline 310<0>-310<31>, herein referred generally as wordline 310, may be coupled to the input of a respective eFuses 206. The output signal of the feedback sensor 304 may be the wordline signal WL<0>-WL<31>.

The wordline decoder 108 may output a pre-wordline signal PWL<0>-PWL<31> to the first input of the feedback sensor 304. The second input of the feedback sensor 304 may be coupled to the output of the pseudo bitline column 302. The output of the pseudo bitline column 302 may be the feedback signal FB<P>. The pseudo bitline column 302 is used to regulate the wordline signals WL<0>-WL<31>. The pseudo bitline in an eFuse 206 sense operation allows the wordline to be open for a small duration so blown fuses are not falsely sensed as an unblown fuse. The pseudo bitline 302 may be referred to as a second bitline.

The pseudo bitline column 302 may be similar to the bitline column 104 (FIG. 2). The pseudo bitline column 302 has an upper bitline 202, a lower bitline 204, a plurality of eFuse cells 106, and a local evaluation unit 306. The eFuse cells may contain an eFuse 206, a blowFET 208, and bitline discharge device 210. The eFuse 206 may have a first end forming an input and a second forming an output. The input of the eFuse 206 may be coupled to the respective wordline 310 of the eFuse 206. Output of the eFuse may be coupled to node 226. The blowFET 208 may have a gate input coupled to a program signal PRG<P>, a source node coupled to the first supply voltage, a drain node coupled to node 226. The bitline discharge device may have a gate input coupled to node 226, a source node coupled to the first supply voltage, and a drain node coupled to the bitline 202. The blowFET 208 and the bitline discharge device may be transistors such as NFETs.

The eFuses 206 of pseudo bitline column 302 are designed to be in their unblown state only having a resistance approximately the same as the first resistance of unblown eFuses 206 of bitline columns 104<0>-104<Z>. Since the eFuses 206 of pseudo bitline column 302 are not to be blown, the blow operation program signal PRG<P> may be disabled and be tied to ground or the first supply voltage.

Pseudo bitline column 302 also has two pre-charge devices. A first pre-charge device 214 has a gate input coupled to PC_LOC0, a source node coupled to the second supply voltage, and a drain coupled to the upper bitline 202. A second pre-charge device 216 has a gate input coupled to PC_LOC1, a source node coupled to the second supply voltage, and a drain coupled to the lower bitline 204. The pre-charge devices 214, 216 may pre-charge the upper and lower bitline 202, 204, and the pre-charge devices 214, 216 may be transistors such as PFETs.

The pseudo bitline column may have the local evaluation unit 306 coupled to the pseudo bitline column. Local evaluation unit 306 may have a logic gate 212, keeper devices 218, 220, a feedback signal device 308 and a logic gate 312. The logic gate 212 may have a first input, a second input, and an output. The first and second inputs of the logic gate 212 may be coupled to the upper and lower bitlines 202, 204 respectively. The output signal of logic gate 212 may be DOT<P>. The keeper devices 218, 220 may have a gate input coupled to the output of the logic gate 212 of pseudo bitline column 302, a source coupled to the second supply voltage, and a drain node coupled to the first and second bitlines respectively. Again, the keeper devices are sized accordingly to prevent the charge on the upper and lower bitlines 202, 204 from falling below Vt of logic gate 212. The keeper devices may be transistors such as PFETs. The logic gate 212 may be a NAND gate.

The feedback signal device 308 may be a logic gate such as an inverter and may have an input and an output. The output of logic gate 212 may be coupled to the input of feedback signal device 308 for receiving signal DOT<P>. The feedback signal device 308 may be an inverter. The logic gate 312 may have a first input, a second input, and an output. Logic gate 312 may be an OR gate. The output of the feedback signal device 308 may be coupled to the first input of a logic gate 312. The second input of logic gate 312 may be coupled to all blowFET 208 gate inputs for receiving any program signal PRG<0>-PRG<Z>, herein referred to as PRG. The output of logic gate 312 may be coupled to the second inputs of the feedback sensors 304. The logic gate 312 may output feedback signal FB<P>. Logic gate 312 may keep FB<P> high when an eFuse blow operation is signaled. During a blow operation, the WL<0> may need to be high for a duration of time to blow an eFuse 206. The duration of time is longer for a wordline signal, such as WL<0>, to be active for blowing an eFuse 206 than the duration of time a wordline signal needs to be active to sense an unblown eFuse. If FB<P> does not remain high during a blow operation, then FB<P> will disable the wordline 310 before the eFuse 206 blows.

The pseudo bitline column 302 along with the local evaluation unit 306 may ensure the correct sensing of a blown eFuse 206 in bitline columns 104<0>-104<Z>. Correct sensing of a blown eFuse 206 may be ensured by keeping the wordline 310 active for a particular duration of time. Having a pseudo bitline column 302 with only unblown eFuses 206 activates the worldline 310 for the appropriate duration by sending the feedback signal, FB<P>, to the feedback sensor 304 once the unblown eFuses 206 of pseudo bitline column 302 are sensed. Having the wordline 310 active for a relatively short duration is necessary because a blown eFuse 206 has some resistance of around 100 kilo-ohms. If the wordline 310 has an active signal for a relatively long enough duration of time, then a blown eFuse 206 may turn on bitline discharge device 210, resulting in the eFuse circuit 300 detecting an eFuse 206 as unblown when, in fact, the eFuse 206 is blown. Thus, having the feedback signal FB<P> from the pseudo bitline column 302 with only unblown, 90 ohm eFuses 206, which may be sensed faster than a blown eFuse 206, may ensure that the wordline signal WL<0> is de-asserted before the bitline discharge device 210, that may be coupled to a blown eFuse 206, activates.

Figure 6:
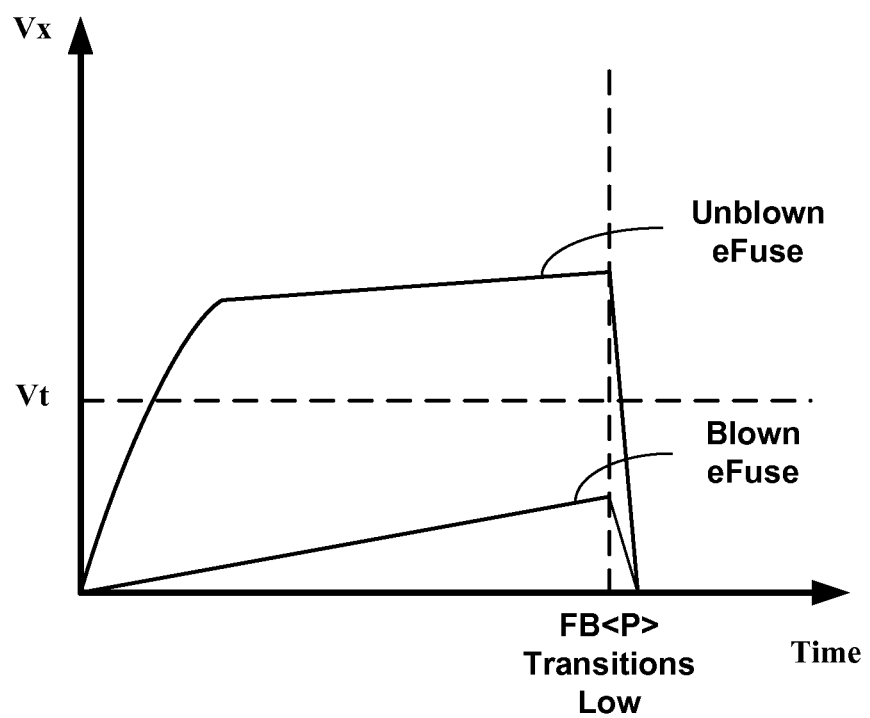
FIG. 6 is a graphical representation of the charge build up of a node output of a blown and unblown eFuse.

As illustrated graphically in FIG. 6, a blown eFuse 206 will slowly charge the node 226 comprising the gate of bitline discharge device 210, the drain of blowFET 208, and the output of eFuse 206. The node 226 has a voltage Vx. An unblown eFuse 206 will charge Vx of node 226 to Vt much quicker than a blown eFuse 206. Having a pseudo bitline 302 with only unblown eFuses 206 and a feedback signal FB<P> to turn off the wordline when an unblown eFuse 206 is sensed, may generally ensure node 226 does not reach Vt when coupled to a blown eFuse 206. As may be seen in FIG. 6, if the feedback signal FB<P> were not asserted at the time shown, the voltage Vx for a blown fuse would continue to increase with time, crossing the threshold voltage Vt.

Figure 4A:
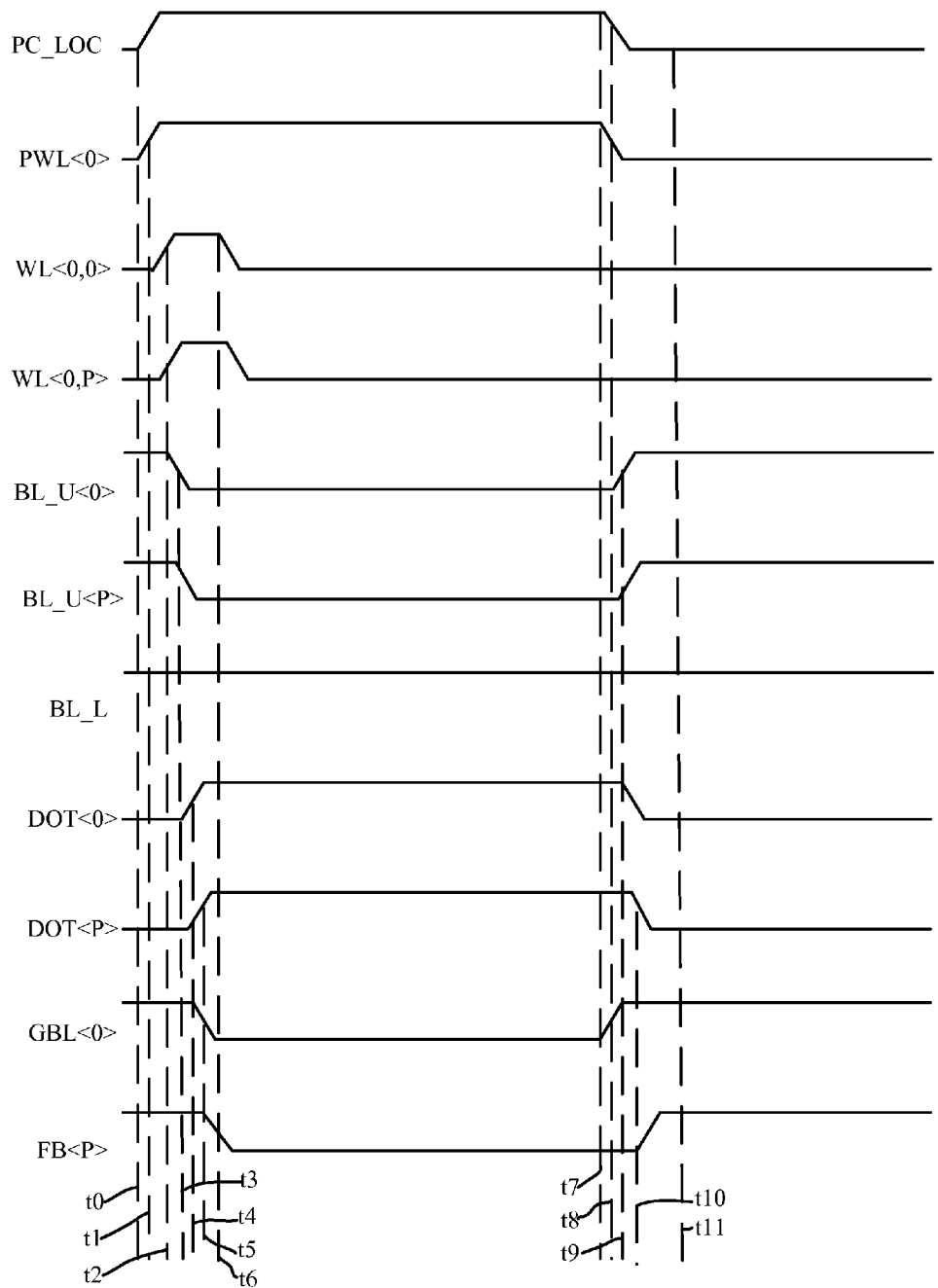
FIGS. 4A and 4B are exemplary timing diagrams illustrating operations of the exemplary eFuse circuit of FIG. 3 for an unblown fuse and blown fuse, respectively, according to an embodiment.
Figure 4B:
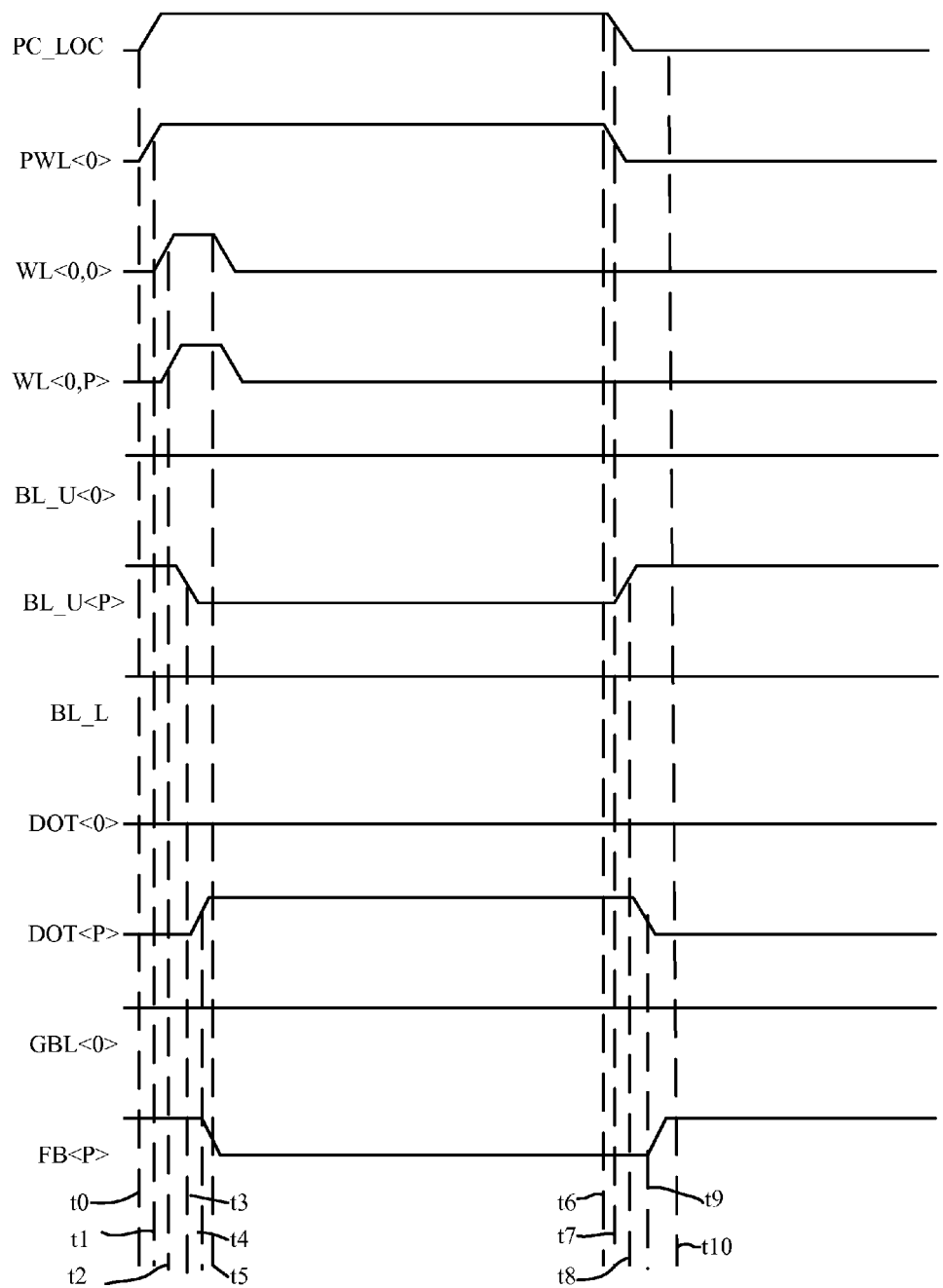

FIG. 4A and FIG. 4B are exemplary timing diagrams illustrating sense operations of the eFuse circuit 300 of FIG. 3. Each wordline 310 may be tested one at a time to determine whether there are blown or unblown eFuses 206 on the wordline 310. Referring now to FIGS. 3 and 4A, a sense operation for detecting an unblown eFuse 206 is next described along wordline 310<0>. FIG. 4B is a timing diagram of a sense operation of the eFuse circuit 300 for detecting a blown eFuse 206 along wordline 310<0>.

The FIGS. 4A and 4B are timing diagrams for an unblown eFuse 206 sense operation and a blown eFuse 206 sense operation respectively. The signals illustrated in the timing diagrams are: PC_LOC, PWL<0>, WL<0,0>, WL<0,P>, BL_U<0>, BL_U<P>, BL_L, DOT<0>, DOT<P>, GBL<0>, FB<P>. Signals from bitline column 104<Z> are omitted for clarity because they generally follow the signals of bitline column 104<0> if all the eFuses 206 along the wordline 310 are in the same state. However, it should be noted that due to wire resistance between the two bitline columns 104<0>, 104<Z>, there may be some propagation delay between the signals of the bitlines columns 104<0>, 104<Z> on the scale of a several picoseconds. Furthermore, besides the timing diagrams focusing on bitline column 104<0> and pseudo bitline column 302 only one wordline, wordline 310<0>, is shown. All other wordlines 310<1>-310<31> may be sequentially tested in the same manner as wordline 310<0>. When referring to a signal or component with a reference such as WL<0,P>, the <0,P> represents coordinates of the position of the signal or component on the eFuse array 102 where the "0" coordinate represents the wordline and the "P" coordinate represents the bitline.

Referring now to the description of the signals, PC_LOC collectively refers to signals PC_LOC0, PC_LOC1, and PC_GLOBAL since these pre-charge signals may be copies of the same signal. PWL<0> is the pre-wordline signal coming from wordline decoder 108 for wordline 310<0>. WL<0,0> and WL<0,P> are the wordline signals on the wordline 310<0> and for bitline column 104<0> and pseudo bitline column 302 respectively. Signals BL_U<0> and BL_U<P> are the upper bitline signals on upper bitline 202 for bitline column 104<0> and pseudo bitline column 302 respectively. BL_L represents the signal on all lower bitlines 204 of the eFuse array 102. Signals DOT<0> and DOT<P> are the signals of the local evaluation units 210, 306 for bitline column 104<0> and pseudo bitline column 302 respectively. GBL<0> is the global bitline signal for bitline column 104<0>, and FB<P> is the feedback signal from feedback signal device 308 and logic gate 312 to the second input of the feedback sensor 304.

The sense operation may begin when the wordline decoder asserts PWL<0> at t0. However, before the sense operation begins (before t0), the bitlines 202, 204 are pre-charged resulting in a charge being present on the upper and lower bitlines 202, 204 and global bitline resulting in BL_U<0>, BL_U<P>, BL_L, and GBL<0> being high at the start of the sense operation. Pre-charging may occur when PC_LOC is low, activating pre-charge devices 214, 216, which charges the upper and lower bitlines 202, 204 to VDD. GBL<0> may also be charged to VDD by a pre-charge device similar to pre-charge device 214, 216. Since BL_U<0>, BL_U<P>, and BL_L are high, they may signal DOT<0> and DOT<P> to be low at the start of the sense operation if input to logic gate 212. A low DOT<P> may cause FB<P> to be high at the beginning of the sense operation if feedback signal device 308 is an inverter. A low DOT<0> activates keeper devices 218, 220 and deactivates global evaluation signaling device 224. Also, a low PWL<0> causes WL<0,0> and WL<0,P> to be low.

At time t0, with reference now to FIG. 4A, the sense operation may begin. PC_LOC may begin its transition from low to high to deactivate the pre-charge devices 214, 216 and the global pre-charge device. Charge may remain on the upper and lower bitlines 202, 204 leaving BL_U<0> BL_U<P> and BL_L high. Keeper devices 218, 220 remain active to keep BL_U<0> BL_U<P> and BL_L high if there is leakage of the bitline signals. Also, at time t0, PWL<0> may activate, which may be asserted in parallel with PC_LOC. The other signals in FIG. 4A may remain unchanged.

Referring to FIG. 4A, which teaches sensing an unblown eFuse 206, at time t1, the transition of PWL<0> from low to high may signal WL<0,0> to activate. With PWL<0> high and FB<P> high the output, WL<0,0>, of feedback sensor 304 is high if feedback sensor 304 is an AND gate. WL<0,P> may be activated high several picoseconds after WL<0,0> due to propagation delay in wordline 310<0>.

At time t2, the transition of WL<0,0> and WL<0,P> from low to high may signal bitline discharge device 210 to activate because eFuse 206 is unblown and has a relatively low resistance, which allows the voltage at output node 226 to increase. The activation of bitline discharge device 210 may signal the charges BL_U<0> and BL_U<P> to discharge to ground on upper bitline 202. BL_L remains high on the lower bitline 204.

At time t3, the transition of BL_U<0> and BL_U<P> from high to low while discharging to ground may signal the output of logic gate 212, DOT<0> and DOT<P>, to transition from low to high. Since BL_L is high and BL_U<0> and BL_U<P> are low, DOT<0> and DOT<P> move high if logic gate 212 is a NAND gate.

At time t4, the transition of DOT<0> from low to high deactivates keeper devices 218, 220. Also, DOT<0> activates global evaluation signal device 224, which begins the transition of GBL<0> from high to low by discharging GBL<0> to ground. The discharge of GBL<0> to ground may signal to the system the eFuse 206 is unblown.

At time t5, DOT<P> transitions from low to high. The transition of DOT<P> from low to high causes FB<P> to deactivate its signal and transition FB<P> from high to low when DOT<P> transitions from low to high through inverter 308.

At time t6, the transition of FB<P> from high to low signals feedback sensors 304 to de-assert wordline signals WL<0,0> and WL<0,P>. The AND logic gate feedback sensors 304 may transition WL<0,0> and WL<0,P> from high to low. The eFuse 206 sense operation with the pseudo bitline column 302 having only unblown eFuses 206 may ensure that WL<0> is active high only long enough to allow the eFuse circuit 300 to sense an unblown eFuse 206. If WL<0> is active high for too much time, then it may allow the eFuse circuit 300 to misinterpret a blown eFuse 206 for an unblown eFuse 206, by charging node 226 where Vx is above Vt activating the gate input of bitline discharge device 210. Therefore, a blown eFuse may activate transistor 210 allowing BL_U<0> to discharge to ground as if the blown eFuse 206 was an unblown eFuse 206.

At time t7, PC_LOC and PWL<0> may be signaled to transition from high to low and GBL<0> may also transition from low to high to end the sense operation. Since GBL<0> has its own pre-charge device. GBL<0> may transition from low to high independently before DOT<0> transitions from high to low.

At time t8, the transition of PC_LOC from high to low may signal the pre-charge devices 214, 216 to activate. Activation of pre-charge devices 214,216 may cause BL_U<0> and BL_U<P> to transition from low to high by charging up to VDD.

At time t9, the transition of BL_U<0> and BL_U<P> from low to high may signal DOT<0> and DOT<P> to transition from high to low respectively.

At time t10, the transition of DOT<P> from high to low may signal FB<P> to transition from low to high.

At time t11, the signals of the eFuse circuit 300 may be returned to the state the signals were in before the start of the sense operation at time t0. The eFuse circuit 300 may now run the sense operation for the eFuses 206 on the next wordline, such as wordline 310<1>.

In one embodiment, referring to the timing diagram illustrated in FIG. 4B, the sense operation may run where one of the wordlines, wordline 310<0> for example, of the eFuse circuit 300 has a blown eFuse 206. In one embodiment, the resistance of the blown eFuse 206 may be greater than the resistance of the unblown eFuse 206. At time t0, the sense operation may begin. PC_LOC may be signaled from low to high to deactivate the pre-charge devices 214, 216 and the global pre-charge device. Charge may remain on the upper and lower bitlines 202, 204 leaving BL_U<0>, BL_U<P>, and BL_L high. Keeper devices 218, 220 may remain active to maintain BL_U<0>, BL_U<P>, and BL_L high. Also, at time t0, PWL<0> may be asserted, which may be asserted in parallel with PC_LOC. PWL<0> is asserted to transition from low to high. The other signals in FIG. 4B remain unchanged.

At time t1, the transition of PWL<0> from low to high may signal WL<0,0> to activate. With PWL<0> high and FB<P> high, the output (WL<0,0>) from feedback sensor 304 may transition from low to high. WL<0,P> may transition from low to high several picoseconds after WL<0,0> due to propagation delay in wordline 310<0>.

At time t2, the transition of WL<0,P> from low to high may signal bitline discharge device 210 of the pseudo bitline column 302 to activate since the eFuse 206 of the pseudo bitline column 302 is unblown, having a relatively small resistance. The activation of bitline discharge device 210 may transition BL_U<P> from high to low by discharging BL_U<P> to ground. However, the transition of WL<0,0> from low to high does not activate bitline discharge device 210 of bitline column 104<0> to discharge BL_U<0> to ground because the eFuse 206 coupled to the bitline discharge device 210 has a high resistance due to being blown. BL_L remains high at time t2.

At time t3, the transition of BL_U<P> from high to low may signal DOT<P> from logic gate 212 of pseudo bitline column 302 to be asserted. DOT<P> may begin to transition from low to high. Since BL_L is high and BL_U<P> is low, DOT<P> transitions high in the situation where logic gate 212 is a NAND gate. DOT<0> remains low.

At time t4, the transition of DOT<P> from low to high may signal keeper devices 218, 220 on the local evaluation unit 306 to deactivate. A high DOT<P> when all PRG signals are low may signal feedback signal device 308 and logic gate 312 to transition FB<P> from high to low. Since DOT<0> does not transition from low to high, GBL<0> may remain charged high, which signals the system the eFuse 206 is blown.

At time t5, the transition of FB<P> from high to low signals WL<0,0> and WL<0,P> to transition from high to low. Since FB<P> is low and PWL<0> is high at t5, WL<0,0> and WL<0,P> will transition from high to low as result of the feedback sensor 304. The sense operation with the pseudo bitline column 302 having only unblown eFuses 206 ensures that wordline 310<0> is active high for enough time to sense unblown eFuses 206, but not long enough to allow the circuit to misinterpret a blown eFuse 206 for an unblown eFuse 206. As mentioned, the gate of bitline discharge device 210 should not reach Vt of bitline discharge device 210 when sensing a blown eFuse 206.

At time t6, PC_LOC and PWL<0> may be signaled to transition from high to low to reset the eFuse 206 sense operation.

At time t7, the transition of PC_LOC and from high to low may signal the pre-charge devices 214, 216, to activate. Activation of pre-charge devices 214,216 signals BL_U<P> to transition from low to high by being charged up to VDD. BL_U<0> and BL_L may remain charged from their initial charge before time t0.

At time t8, the transition of BL_U<P> from low to high signals DOT<P> to transition from high to low.

At time t9, the transition of DOT<P> from high to low signals FB<P> to transition from low to high.

At time t10, the signals of the eFuse circuit 300 may be returned to the state the signals were in before the start of the sense operation at time t0. The eFuse circuit 300 may now run the sense operation for the remaining wordlines, 310<1>-310<31>.

While the Detailed Description may refer to specific types of transistors, logic gates, supply voltages, and the like it will be appreciated that one skilled in the art may implement same or similar functions using different transistors, logic gates, and supply voltages in alternative embodiments as described and still accomplish the same purpose of the invention. For example, transistors may be PFETs or NFETs. Logic gates may be AND, OR, XOR, NOR, NAND, XNOR or inverters. Therefore, the scope of the invention should not be limited.

Figure 5:
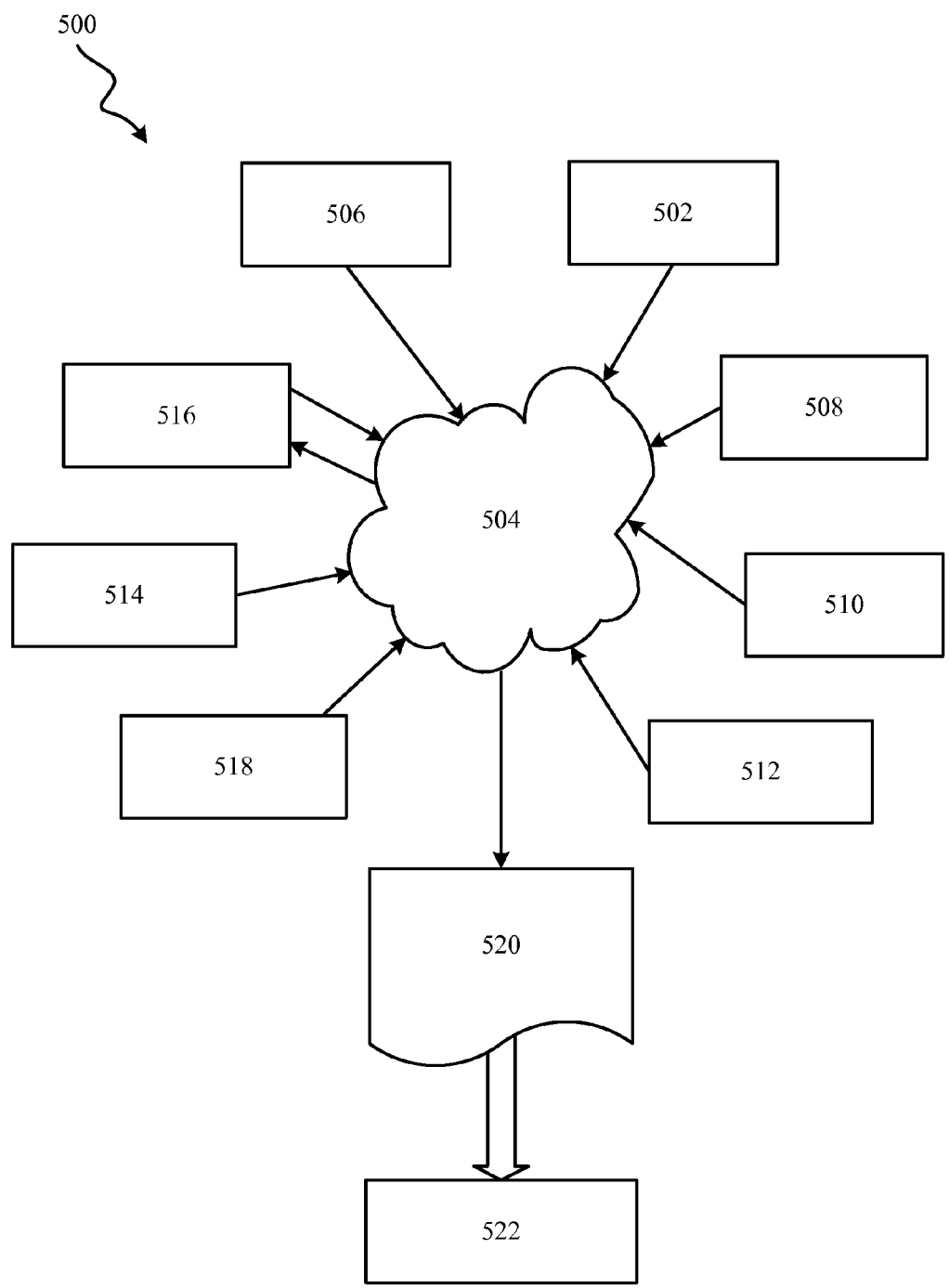
FIG. 5 is a flow diagram of a design process used in semiconductor design, manufacturing, and testing according to an embodiment.

FIG. 5 shows a block diagram of an example design flow 500 that may be used for the eFuse circuit described herein. Design flow 500 may vary depending on the type of integrated circuit (IC) being designed. For example, a design flow 500 for building an application specific IC (ASIC) may differ from a design flow 500 for designing a standard component. Design structure 502 is preferably an input to a design process 504 and may come from an IP provider, a core developer, or other design company or may be generated by the operator of the design flow, or from other sources. Design structure 502 comprises eFuse circuit 100, 300 or bitline column 104 in the form of schematics or HDL, a hardware-description language, for example, Verilog, VHDL, C, and the like. Design structure 502 is tangibly contained on, for example, one or more machine readable storage medium. For example, design structure 502 may be a text file or a graphical representation of local evaluation unit 110, eFuse circuit 100, 300 or bitline column 104. Design process 504 preferably synthesizes, or translates, local evaluation local evaluation unit 110, eFuse circuit 100, or bitline column 104 into a netlist 506, where netlist 506 is, for example, a list of wires, transistors, logic gates, control circuits, I/O, models, etc. that describes the connections to other elements and circuits in an integrated circuit design and recorded on at least one of machine readable storage medium. This may be an iterative process in which netlist 506 is resynthesized one or more times depending on design specifications and parameters for the circuit.

Design process 504 may include using a variety of inputs; for example, inputs from library elements 508 which may house a set of commonly used elements, circuits, and devices, including models, layouts, and symbolic representations, for a given manufacturing technology, such as different technology nodes, 32 nm, 45 nm, 90 nm, and the like, design specifications 510, characterization data 512, verification data 514, design rules 516, and test data files 518, which may include test patterns and other testing information. Design process 504 may further include, for example, standard circuit design processes such as timing analysis, verification, design rule checking, place and route operations, and the like. One of ordinary skill in the art of integrated circuit design can appreciate the extent of possible electronic design automation tools and applications used in design process 504 without deviating from the scope and spirit of the invention. The design structure of the invention is not limited to any specific design flow.

Design process 504 preferably translates an embodiment of the invention as shown in FIGS. 1-3 along with any additional integrated circuit design or data (if applicable), into a second design structure 520. Design structure 520 resides on a machine readable storage medium in a data format used for the exchange of layout data of integrated circuits, for example, information stored in a GDSII (GDS2), GL1, OASIS, or any other suitable format for storing such design structures. Design structure 520 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-3. Design structure 520 may then proceed to a stage 522 where, for example, design structure 520 proceeds to tape-out, is released to manufacturing, is released to a mask house, is sent to another design house, is sent back to the customer, and the like.

While the present invention has been described with reference to the details of the embodiments of the invention shown in the drawings, these details are not intended to limit the scope of the invention as claimed in the appended claims.

What is claimed is:

1. An eFuse circuit comprising:
   a wordline adapted to receive a wordline signal;
   a first eFuse having a first end coupled to the wordline and a second end, the first eFuse having a first resistance when unblown and a second resistance when blown, the wordline capable of driving enough current to blow the first eFuse with the wordline signal;
   a first blowFET having a source coupled to a first supply voltage, a gate coupled to a program signal, and a drain coupled to the second end of the first eFuse; and
   a first bitline discharge device having a gate coupled to the second end of the first eFuse, a source coupled to the first supply voltage, and a drain coupled to a first bitline.

2. The eFuse circuit of claim 1 further comprising:
   a second eFuse having a first end coupled to the wordline and a second end, the second eFuse having a first resistance generally equal to the first resistance of the first eFuse;
   a second blowFET having a source coupled to the first supply voltage, a gate coupled to the first supply voltage, and a drain coupled to the second end of the second eFuse; and
   a second bitline discharge device having a gate coupled to the second end of the second eFuse, a source coupled to the first supply voltage, and a drain coupled to a pseudo bitline column acting as a second bitline.

3. The eFuse circuit of claim 1 further comprising:
   a first local evaluation unit coupled to the first bitline, the first local evaluation unit including
      a second logic gate having at least one input and an output, an input of the second logic gate coupled to the first bitline;
      a first keeper device having a gate coupled to the output of the second logic gate, a source coupled to a second supply voltage, and a drain coupled to the first bitline; and
      a global evaluation device having a gate coupled to the output of the second logic gate, a drain coupled to a global bitline, and a source coupled to the first supply voltage.

4. The eFuse circuit of claim 1 further comprising;
   a first pre-charge device having a source coupled to the second voltage, a gate coupled to a pre-charge signal, and a drain coupled to the first bitline.

5. The eFuse circuit of claim 2 further comprising:
   a second local evaluation unit coupled to the second bitline, the second local evaluation unit including:
      a third logic gate having at least one input and an output, the input of the third logic gate coupled to the second bitline;
      a second keeper device having a gate coupled to the output of the third logic gate, a source coupled to the second supply voltage, and a drain coupled to the second bitline; and
      the output of the third logic gate coupled to an input of a first logic gate, wherein the output of the third logic gate and the program signal regulates the output of the first logic gate, wherein the output of the first logic gate is a feedback signal that signals a feedback sensor a duration of time the wordline signal is to be active, wherein the feedback sensor controls the wordline signal received by the wordline.

6. The eFuse circuit of claim 2 further comprising;
   a second pre-charge device having a source coupled to the second supply voltage, a gate coupled to the pre-charge signal, and a drain coupled to the second bitline.

7. The eFuse circuit of claim 1, wherein the first supply voltage is ground.

8. The eFuse circuit of claim 3, wherein the second supply voltage is Vdd.

9. A method of sensing the state of an eFuse comprising:
   providing a first eFuse having a first end coupled to a wordline and a second end, the first eFuse having a first resistance when unblown and a second resistance when blown, the wordline capable of driving enough current to blow the first eFuse with a wordline signal;
   providing a first blowFET having a source coupled to a first supply voltage, a gate coupled to a program signal, and a drain coupled to the second end of the first eFuse;
   blowing the first eFuse when the program signal and the wordline signal are active; and
   detecting the resistance of the first eFuse when the wordline signal is active by a first bitline discharge device having a gate coupled to the second end of the first eFuse, a source coupled to the supply voltage, and a drain coupled to a first bitline.

10. The method of claim 9 further comprising:
    providing a second eFuse having a first end coupled to the wordline and a second end, the second eFuse having a first resistance generally equal to the first resistance of the first eFuse;
    providing a second blowFET having a source coupled to the first supply voltage, a gate coupled to the first supply voltage, and a drain coupled to the second end of the second eFuse; and
    detecting the resistance of the second eFuse by a second bitline discharge device having a gate coupled to the second end of the second eFuse, a source coupled to the first supply voltage, and a drain coupled to a pseudo bitline column acting as a second bitline.

11. The method of claim 9 further comprising:
detecting the resistance of the first eFuse with a first local evaluation unit coupled to the first bitline, the first local evaluation unit including
  a second logic gate having at least one input and an output, the input of the second logic gate coupled to the first bitline;
  a first keeper device having a gate coupled to the output of the second logic gate, a source coupled to a second supply voltage and a drain coupled to the first bitline; and
  a global evaluation device having a gate coupled to the output of the second logic gate, a drain coupled to a global bitline, and a source coupled to the first supply voltage.

12. The method of claim 10 further comprising:
detecting the first resistance of the second eFuse with a second local evaluation unit coupled to the second bitline, the second local evaluation unit including
  a third logic gate having at least one input and an output, the input of the third logic gate coupled to the second bitline and the output coupled to an input of a first logic gate;
  a second keeper device having a gate coupled to the output of the third logic gate, a source coupled to the second supply voltage and a drain coupled to the second bitline; and
  the output of the third logic gate coupled to an input of the first logic gate wherein, the output of the third logic gate and the program signal determines the output of the first logic gate; and
signaling the input of the first logic gate to output a feedback signal that signals a feedback sensor a duration of time the wordline signal is to be active, wherein the feedback sensor controls the wordline signal received by the wordline.

13. The eFuse circuit of claim 9 further comprising:
pre-charging the first bitline with a first pre-charge device having a source coupled to the second voltage, a gate coupled to a pre-charge signal, and a drain coupled to the first bitline.

14. The eFuse circuit of claim 10 further comprising:
pre-charging the second bitline with a second pre-charge device having a source coupled to the second supply voltage, a gate coupled to the pre-charge signal, and a drain coupled to the second bitline.

15. The method of claim 9, wherein the first supply voltage is ground.

16. The method of claim 11, wherein the second supply voltage is Vdd.

17. A design structure tangibly embodied in a machine readable medium used in a design process, the design structure comprising:
  an eFuse circuit including a wordline adapted to receive a wordline signal;
  a first eFuse having a first end coupled to the wordline and a second end, the first eFuse having a first resistance when unblown and a second resistance when blown, the wordline capable of driving enough current to blow the first eFuse with the wordline signal;
  a first blowFET having a source coupled to a first supply voltage, a gate coupled to a program signal, and a drain coupled to the second end of the first eFuse; and
  a first bitline discharge device having a gate coupled to the second end of the first eFuse, a source coupled to the first supply voltage, and a drain coupled to a first bitline.

18. The design structure of claim 17, wherein the design structure comprises a netlist, which describes the eFuse circuit.

19. The design structure of claim 17, wherein the design structure resides on a storage medium as a data format used for the exchange of layout data of integrated circuits.

20. The design structure of claim 17, wherein the design structure includes at least one of test data files, characterization data, verification data, or design specifications.

* * * * *